United States Patent
de Samber

(10) Patent No.: US 9,246,072 B2
(45) Date of Patent: Jan. 26, 2016

(54) LED MIXING CHAMBER WITH REFLECTIVE WALLS FORMED IN SLOTS

(75) Inventor: Marc Andre de Samber, Lommel (BE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/237,448

(22) PCT Filed: Aug. 14, 2012

(86) PCT No.: PCT/IB2012/054128
§ 371 (c)(1),
(2), (4) Date: Feb. 6, 2014

(87) PCT Pub. No.: WO2013/024428
PCT Pub. Date: Feb. 21, 2013

(65) Prior Publication Data
US 2014/0175466 A1    Jun. 26, 2014

Related U.S. Application Data

(60) Provisional application No. 61/523,869, filed on Aug. 16, 2011.

(51) Int. Cl.
*H01L 33/60* (2010.01)
*H01L 33/52* (2010.01)
*H01L 25/075* (2006.01)
*H01L 33/50* (2010.01)

(52) U.S. Cl.
CPC ............ *H01L 33/52* (2013.01); *H01L 25/0753* (2013.01); *H01L 33/50* (2013.01); *H01L 33/60* (2013.01); *H01L 33/507* (2013.01); *H01L 2224/16* (2013.01); *H01L 2933/0058* (2013.01)

(58) Field of Classification Search
CPC .......................................... H01L 33/00–33/648
USPC ............................................................ 257/88
See application file for complete search history.

(56) References Cited

U.S. PATENT DOCUMENTS 7,777,412 B2 *  8/2010  Pang .............................. 313/506
8,581,284 B2 * 11/2013  Seko ............................... 257/98
(Continued)

FOREIGN PATENT DOCUMENTS

EP    2221885 A1    8/2010
WO    0233756 A1    5/2002
(Continued)

*Primary Examiner* — Matthew Landau
*Assistant Examiner* — Eric Ward
(74) *Attorney, Agent, or Firm* — Patent Law Group LLP; Brian D. Ogonowsky

(57) ABSTRACT

A relatively large substrate has a reflective surface, such as a diffusive white surface. LED dies, either as bare LED dies or packaged LED dies, are mounted to the substrate to form separate arrays of LEDs. Each array is intended for a separate mixing chamber. A layer of an encapsulant, such as silicone, is deposited over the substrate to encapsulate the LED dies. A laser etches through the encapsulant to form slots, and a reflective material, such as a white paint, is deposited in the slots to form reflective walls of each mixing chamber. If desired, a phosphor layer is deposited over the encapsulant and reflective walls. The substrate is then singulated to separate out the mixing chambers. Since no discrete parts are assembled, and multiple mixing chambers are formed simultaneously, the resulting mixing chambers are inexpensive and very reliable.

6 Claims, 2 Drawing Sheets

(56) References Cited

U.S. PATENT DOCUMENTS

| | | | |
|---|---|---|---|
| 2007/0114555 A1 | 5/2007 | Takemoto et al. | |
| 2007/0205425 A1* | 9/2007 | Harada | 257/98 |
| 2007/0284602 A1 | 12/2007 | Chitnis et al. | |
| 2008/0180960 A1* | 7/2008 | Harrah | 362/363 |
| 2008/0203419 A1* | 8/2008 | Harada | 257/98 |
| 2010/0258830 A1* | 10/2010 | Ide et al. | 257/98 |
| 2010/0277925 A1* | 11/2010 | Tan et al. | 362/304 |
| 2011/0018017 A1 | 1/2011 | Bierhuizen | |
| 2011/0044026 A1* | 2/2011 | Deeben et al. | 362/84 |
| 2011/0254030 A1* | 10/2011 | Ahlisch et al. | 257/98 |

FOREIGN PATENT DOCUMENTS

| | | |
|---|---|---|
| WO | 2007032619 A1 | 4/2007 |
| WO | 2010035206 A1 | 4/2010 |

\* cited by examiner

LED MIXING CHAMBER WITH REFLECTIVE WALLS FORMED IN SLOTS

CROSS-REFERENCE TO PRIOR APPLICATIONS

This application is the U.S. National Phase application under 35 U.S.C. §371 of International Application No. PCT/IB2012/054128, filed on Aug. 14, 2012, which claims the benefit of U.S. 61/523,869 filed Aug. 16, 2011. These applications are incorporated by reference herein.

FIELD OF THE INVENTION

This invention relates to mixing chambers for light emitting diodes (LEDs) and, in particular, to a method of forming a mixing chamber having reflective walls.

BACKGROUND

For general lighting purposes or for forming a backlight for an LCD display, it is known to mount an array of LEDs on a reflective printed circuit board (PCB), then mount the PCB in a box having reflective sidewalls. The LEDs may be red, green, and blue, whose mixture creates white light, or only blue LEDs may be used in combination with a phosphor for creating white light. A diffuser is typically placed over the top of the box, if needed. A generally uniform light is thus emitted from the mixing chamber due to the mixing and diffusing.

Such a mixing chamber requires handling and assembly of discrete parts. As a result, the mixing chambers are relatively expensive.

What is needed is an improved technique for forming a mixing chamber containing LEDs.

SUMMARY

The below technique is only one embodiment of a method for forming mixing chambers in accordance with the present invention. Other embodiments are also within the scope of the invention.

A relatively large substrate is provided having metal pads and traces leading to power supply terminals. The substrate has a reflective surface, such as a diffusive white surface. The substrate, in one example, will form four mixing chambers.

LED dies, either as bare LED dies or packaged LED dies, are mounted to the substrate to form separate arrays of LED dies. Each array is intended for a separate mixing chamber. In the example, there are four arrays of LED dies mounted on the substrate.

A rectangular metal ring is formed around each array of LED dies for use as a laser etch stop.

A layer of an encapsulant, such as silicone, is deposited over the substrate and the metal rings to encapsulate the LED dies. The encapsulant may be deposited as a liquid and cured, or the encapsulant may be laminated over the substrate using heat and pressure, and then cured, to encapsulate the LED dies.

A laser is then used to etch through the encapsulant over the metal rings to form slots, where the metal rings act as a laser etch stop to prevent etching through the substrate. The laser may optionally etch along the singulation lines so that the encapsulant is not sawed during the subsequent singulation process.

A reflective material, such as a white paint, is then deposited in the slots around each of the LED arrays to form reflective walls of each mixing chamber. The reflective material, if a paste or liquid material, may be easily squeegeed into the slots. The surface of the encapsulant is then cleaned if needed.

If the LED dies only emit blue light, and the desired emission is to be white light, a phosphor layer may be deposited over the encapsulant and reflective walls. The phosphor layer may be a pre-formed tile approximately the size of the substrate.

The substrate is then singulated to separate the four mixing chambers.

The resulting mixing chambers may then be coupled to the back of an LCD display and used as a backlight. Since no discrete parts are assembled, and multiple mixing chambers are formed simultaneously, the resulting mixing chambers are inexpensive and reliable.

DETAILED DESCRIPTION

Figure 1:
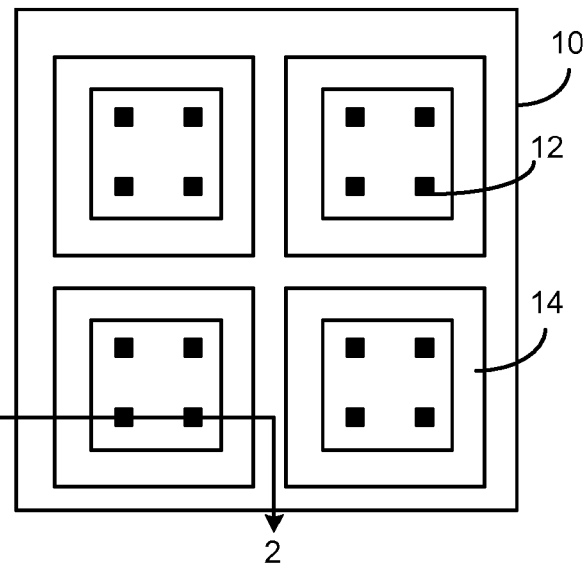
FIG. 1 is a top down view of a reflective substrate having metal pads and traces for interconnecting a plurality of LED dies. Metal rings are shown circumscribing associated LED arrays.

FIG. 1 is a top down view of a reflective substrate 10. The substrate 10 may be a submount formed of a ceramic, insulated metal, FR-4, or other material. The substrate 10 has metal pads and traces on its top surface for interconnecting a plurality of LED dies 12 mounted on the substrate 10. The top metal pads may be connected by through-vias to bottom metal pads that are to be soldered to pads of a printed circuit board or other device. In another embodiment, no vias are used, and the top metal pads extend to other pads on the top surface that are to be connected to a power supply. Metal rings 14, such as formed of copper, are shown circumscribing associated LED arrays.

The top surface of the substrate 10 may be coated with a reflective white paint or other suitable reflective coating, such as a laminated reflective layer.

There may be any number of LED dies 12 in each array, depending on the desired size of the mixing chamber and brightness, and the array can be any shape. In one embodiment, the LED dies 12 are bare, flip-chip dies. The LED dies may instead have one or more top electrodes for wire bonding. In another embodiment, the LED dies 12 are packaged with or without lenses.

In one embodiment, the LED dies 12 are all GaN based and emit blue light. In another embodiment, there are red, green, and blue LED dies 12, whose light, when mixed, produce white light. Each LED die 12 comprises n-type semiconductor layers, p-type semiconductor layers, an active layer between the n and p-type layers, and at least two electrodes for electrically contacting the n and p-type layers.

Figure 2:
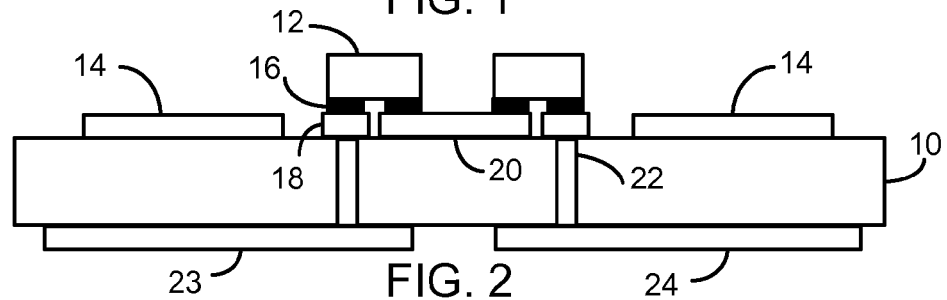
FIG. 2 is a cross-sectional view along line 2-2 in FIG. 1 showing two LED dies within the area of a single mixing chamber.

FIG. 2 is a cross-sectional view along line 2-2 in FIG. 1 showing two of the four LED dies 12 for use in a single mixing chamber prior to singulation of the substrate 10. The LED electrodes 16, formed on the bottom surface of the LED dies 12, are bonded to corresponding metal pads 18 and 20 on the substrate 10. Bonding may be by ultrasonic welding, soldering, or other means. The LED dies 12 are connected in series in the example by a trace connected between the LED electrodes 16. At least some of the metal pads 18 and 20 are connected by metal-filled vias 22 to robust bottom metal pads 23 and 24 for soldering to a printed circuit board or other device that supplies power to the LED dies 12.

The metal rings 14 are shown defining the boundaries of each mixing chamber.

The metal layers may be formed by printing (e.g., laminating a copper layer then selective etching), sputtering, or any other suitable technique.

The LED dies 12 may be on the order of 1 mm$^2$. The substrate 10 may be any size, such as a square with sides of 30 cm or more.

Figure 3:
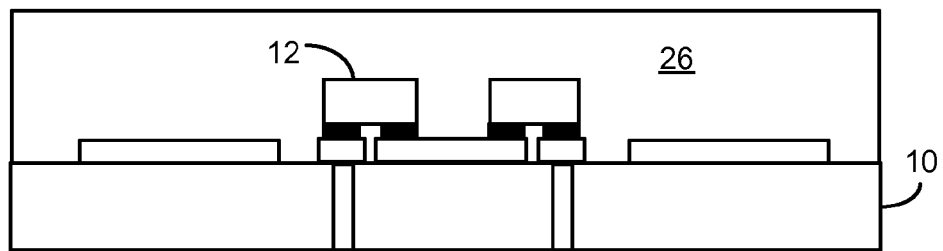
FIG. 3 illustrates an encapsulant deposited over the substrate.

FIG. 3 illustrates an example of encapsulant 26 deposited over the substrate 10 to hermetically seal the LED dies 12 and provide a high index of refraction interface material. The encapsulant 26 may be silicone, SUB, epoxy, or other material. The encapsulant 26 may be spun on or otherwise deposited as a liquid and cured. Alternatively, the encapsulant 16 may be pre-formed as a softened sheet and laminated on the substrate 10 using heat and pressure. The encapsulant 26 is then cured. In the example, the top surface of the encapsulant 26 is substantially planar but other surface shapes may be used. The thickness of the encapsulant 26 defines the height of the mixing chamber walls. The encapsulant 26 thickness may only be a few millimeters.

Figure 4:
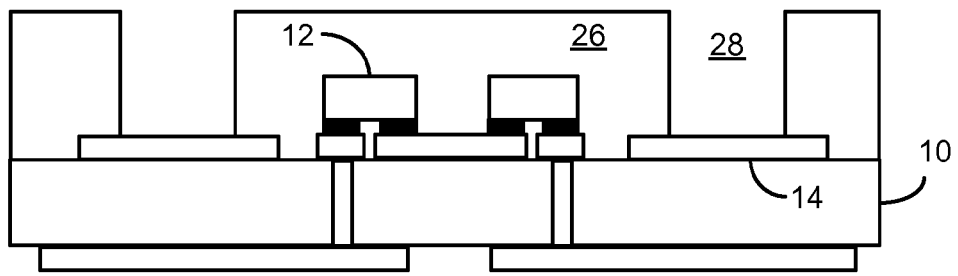
FIG. 4 illustrates slots formed through the encapsulant by a laser, where the slots define the locations of reflective sidewalls for each mixing chamber.

FIG. 4 illustrates slots 28 formed through the encapsulant 26 by a exemplary 355 nm pulsed laser, where the slots 28 define the locations of reflective sidewalls for each mixing chamber. The metal rings 14 provide an etch stop for the laser to prevent damage to the substrate 10. The laser can be automatically aligned to the metal rings 14. Instead of a laser, any other suitable masking and etching process may be used.

Figure 5:
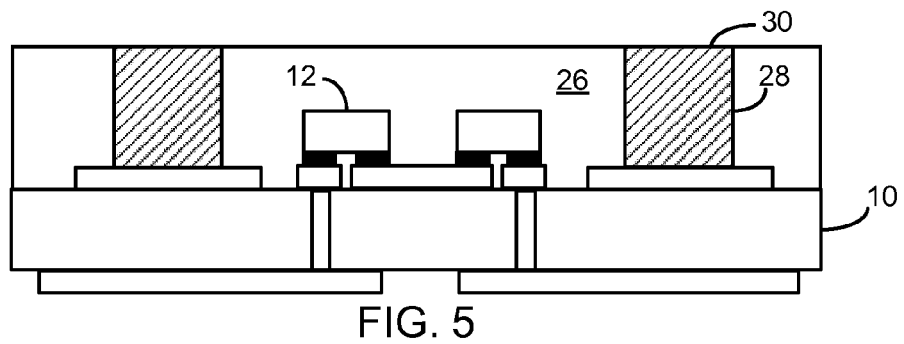
FIG. 5 illustrates the slots filled with a reflective material.

FIG. 5 illustrates the slots 28 filled with a reflective material 30, such as a suitable white paint (e.g., containing TiO$_2$) that is squeegeed over the surface of the encapsulant 26. Screen printing or other processes can be used. The reflective material 30 may be a liquid, paste, dry particles, or other suitable material. The reflective material 30 forms the reflective walls of the mixing chamber after curing. If needed, the top surface of the encapsulant 26 is then cleaned. The top surface of the encapsulant may be roughened for increased light extraction and/or to diffuse the light.

Figure 6:
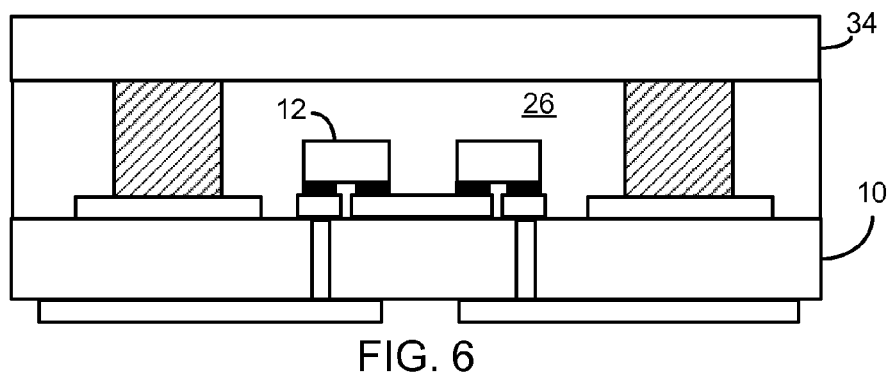
FIG. 6 illustrates a phosphor layer deposited over the encapsulant, if needed, to produce white light.

FIG. 6 illustrates a phosphor layer 34 deposited over the top surface of encapsulant 26, if needed, to produce white light. The phosphor layer 34 may be deposited in any manner. In one embodiment, the phosphor layer 34 is a pre-formed sheet that is affixed to the encapsulant 26 by, for example, a thin layer of silicone. In other embodiments, the phosphor layer 34 is initially a liquid or partially cured material and sprayed on, spun on, or deposited in other ways. Additionally, the phosphor layer 34 may be deposited as a continuous layer, deposited as a pre-defined pattern (such as dots), deposited to have a graded thickness, or patterned using a post-process step. If it is desired to not singulate through the phosphor layer 34, the phosphor may be deposited so as to be absent over the singulation lines.

If RGB LED dies 12 are used, the phosphor layer 34 may be replaced by a diffusion layer. Optionally a diffusion layer may be deposited over the phosphor layer 34.

The substrate 10 is then singulated, such as by sawing, between the metal rings 14. Each mixing chamber may resemble FIG. 6. The light from the various LED dies 12 will be mixed by the wide angle emissions from each LED die 12, the reflections off the substrate 10 surface, and the reflections off the sidewalls. The phosphor layer 34 also diffuses the light. If desired for increased uniformity of emission, a diffusion layer may be inserted, or the top surface of the encapsulant 26 is roughened or formed to have micro-lenses prior to depositing the phosphor layer 34.

Figure 7:
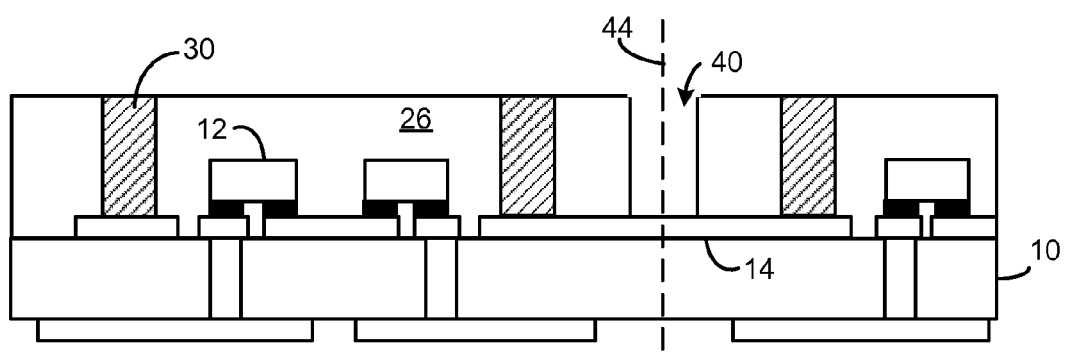
FIG. 7 illustrates an alternative embodiment, where the laser additionally etches slots corresponding to singulation lines so that the subsequent sawing does not need to cut through organic layers.

FIG. 7 illustrates an alternative embodiment, where the laser additionally etches slots 40 through the encapsulant 26 corresponding to singulation lines 44 so that the subsequent sawing does not need to cut through organic layers. In such a case, the metal rings 14 may extend across the boundaries of the mixing chambers to act as laser etch stops.

In one embodiment, each mixing chamber may contain only a single LED die, and the mixing of the light rays creates a substantially uniform light emission within the boundaries of the mixing chamber.

As seen, many mixing chambers are simultaneously fabricated on a wafer scale with no separate parts to handle or assemble. The resulting mixing chambers are therefore inexpensive and reliable.

The mixing chambers may be used to backlight LCDs of any size. The mixing chambers may also be used to produce white light for general illumination purposes.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is being claimed is:

1. A device comprising:
   a substrate, the substrate having at least a portion of a first surface being reflective;
   a plurality of LED dies mounted on the first surface of the substrate;
   a metal ring formed over the substrate and surrounding the plurality of LED dies, the metal ring providing a etch stop, the metal ring having a width that extends at least to a singulation line for the device;
   a mixing chamber comprising:
      a light-transmissive covering layer over the substrate, metal ring, and LED dies;
      a slot etched in the covering layer surrounding the LED dies, the slot being formed overlying the metal ring while using the metal ring as an etch stop;
      a reflective material at least partially filling the slot to form a reflective wall around the LED dies, the reflective wall having a height above the substrate that is greater than a height of a top surface of the LED dies above the substrate, the reflective wall having an inside surface facing the plurality of LED dies and having an outside surface; and
      a portion of the covering layer being present around the outside surface of the reflective material after singulation of the substrate to form individual devices, wherein the metal ring extends beyond the outside surface of the reflective material to the singulation line, wherein the covering material around the outside surface of the reflective material and above the metal ring is etched, using the metal ring as an etch stop, followed by singulation of the substrate.

2. The device of claim 1 wherein the LED dies emit blue light, the device further comprising depositing a wavelength converting layer overlying the covering layer.

3. The device of claim 2 wherein the wavelength converting layer is applied as sheet material, liquid material, partially cured material, or spin-on material.

4. The device of claim 1 wherein the covering layer has a substantially planar top surface.

5. The device of claim 1 wherein the covering layer encapsulates the LED dies.

6. The device of claim 1 wherein the LED dies are bare dies.

* * * * *